United States Patent
Lamouroux et al.

(10) Patent No.: US 11,512,024 B2
(45) Date of Patent: Nov. 29, 2022

(54) METHOD FOR DENSIFYING POROUS ANNULAR SUBSTRATES BY CHEMICAL VAPOUR INFILTRATION

(71) Applicant: SAFRAN CERAMICS, Le Haillan (FR)

(72) Inventors: Franck Lamouroux, Moissy-Cramayel (FR); Rémy Dupont, Moissy-Cramayel (FR); Sébastien Bertrand, Moissy-Cramayel (FR); Stéphane Roger André Goujard, Moissy-Cramayel (FR); Matthieu Champagne, Moissy-Cramayel (FR); Olivier Clausse, Moissy-Cramayel (FR); Jean-Michel Garcia, Moissy-Cramayel (FR); Jeff Roustand, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 17/267,363

(22) PCT Filed: Aug. 12, 2019

(86) PCT No.: PCT/EP2019/071602
§ 371 (c)(1),
(2) Date: Feb. 9, 2021

(87) PCT Pub. No.: WO2020/030823
PCT Pub. Date: Feb. 13, 2020

(65) Prior Publication Data
US 2021/0261471 A1 Aug. 26, 2021

(30) Foreign Application Priority Data
Aug. 10, 2018 (FR) ........................ 1857435

(51) Int. Cl.
*B32B 9/00* (2006.01)
*C04B 35/83* (2006.01)
(Continued)

(52) U.S. Cl.
CPC ........ *C04B 35/83* (2013.01); *C04B 35/62873* (2013.01); *C04B 35/62884* (2013.01);
(Continued)

(58) Field of Classification Search
CPC ........ B32B 9/007; B82Y 30/00; Y10T 428/30
(Continued)

(56) References Cited

U.S. PATENT DOCUMENTS 5,904,957 A 5/1999 Christin et al.
6,572,371 B1 6/2003 Sion et al.
(Continued)

FOREIGN PATENT DOCUMENTS

CA 2218317 A1 10/1996
CN 1511198 A 7/2004
(Continued)

OTHER PUBLICATIONS

International Preliminary Report on Patentability and the Written Opinion of the International Searching Authority as issued in International Patent Application No. PCT/EP2019/071602, dated Feb. 16, 2021.
(Continued)

*Primary Examiner* — Daniel H Miller
(74) *Attorney, Agent, or Firm* — Pillsbury Winthrop Shaw Pittman LLP

(57) ABSTRACT

A method for densifying porous annular substrates by chemical vapor infiltration, includes providing a plurality of unit modules including a support tray on which substrates are stacked, the support tray including a gas intake opening extended by an injection tube disposed in an internal volume
(Continued)

formed by the central passages of the stacked substrates, the injection tube including gas injection orifices opening into the internal volume, forming stacks of unit modules in the enclosure of a densification furnace and injecting, into the stacks of unit modules, a gas phase including a gas precursor of a matrix material to be deposited within the porosity of the substrates.

13 Claims, 4 Drawing Sheets

(51) Int. Cl.
*C04B 35/628* (2006.01)
*C23C 16/04* (2006.01)
*C23C 16/455* (2006.01)
*F16D 69/02* (2006.01)
*F16D 65/12* (2006.01)

(52) U.S. Cl.
CPC ...... *C23C 16/045* (2013.01); *C23C 16/45578* (2013.01); *F16D 69/023* (2013.01); *C04B 2235/422* (2013.01); *C04B 2235/5248* (2013.01); *C04B 2235/614* (2013.01); *F16D 65/126* (2013.01); *F16D 2200/0052* (2013.01); *F16D 2200/0065* (2013.01); *F16D 2200/0091* (2013.01); *Y10T 428/30* (2015.01)

(58) Field of Classification Search
USPC .......................................... 428/408; 423/448
See application file for complete search history.

(56) References Cited

U.S. PATENT DOCUMENTS

| | | |
|---|---|---|
| 7,691,440 B2 | 4/2010 | Bernard et al. |
| 2003/0035893 A1 | 2/2003 | Daws et al. |
| 2003/0118728 A1 | 6/2003 | Sion et al. |
| 2003/0205203 A1 | 11/2003 | Sion et al. |
| 2007/0014990 A1 | 1/2007 | Arico et al. |
| 2008/0152803 A1 | 6/2008 | Lamouroux et al. |
| 2012/0171375 A1 | 7/2012 | Lamouroux et al. |

FOREIGN PATENT DOCUMENTS

| | | |
|---|---|---|
| CN | 1608142 A | 4/2005 |
| CN | 1650042 A | 8/2005 |
| CN | 101120116 A | 2/2008 |
| EP | 1 285 976 A2 | 2/2003 |
| EP | 1 285 976 A3 | 2/2003 |
| EP | 1 598 442 A1 | 11/2005 |
| FR | 2 754 813 A1 | 4/1998 |
| FR | 2 821 859 A1 | 9/2002 |
| FR | 2 834 713 A1 | 7/2003 |
| WO | WO 03/060183 A1 | 7/2003 |

OTHER PUBLICATIONS

International Search Report as issued in International Patent Application No. PCT/EP2019/071602, dated Oct. 11, 2019.
Communication under Rule 71(3) EPC as issued in European Patent Application No. 19 749 766.2, dated Dec. 21, 2021.

METHOD FOR DENSIFYING POROUS ANNULAR SUBSTRATES BY CHEMICAL VAPOUR INFILTRATION

CROSS-REFERENCE TO RELATED APPLICATIONS

This application is the U.S. National Stage of PCT/EP2019/071602, filed Aug. 12, 2019, which in turn claims priority to French patent application number 1857435 filed Aug. 10, 2018. The content of these applications are incorporated herein by reference in their entireties.

BACKGROUND OF THE INVENTION

The present invention relates to the general field of methods for densifying porous annular substrates by Chemical Vapor Infiltration (CVI).

To densify such substrates, methods are in particular known in which stacks of substrates are disposed in the heated enclosure of a densification installation, and a gas phase comprising a matrix material precursor is introduced inside the stacks of substrates so as to form the matrix in the porosity of the substrates. Document FR 2834713 describes such a method and an installation for its implementation.

When it is desired to densify a large number of stacks of substrates, a larger installation is generally used. A known example of loading that can be used in the enclosure 1 of a densification furnace is illustrated in FIG. 1. The enclosure 1 is cylindrical about an axis X. The loading comprises a plurality of stacks of porous annular substrates 2 carried by the same lower support tray 3. Each stack is formed of several sections 4 of superimposed stacks separated by intermediate support trays 5 common to all the stacks. The trays 3 and 5 comprise openings aligned with central passages of the substrates 2 in order to circulate in each stack a reactive gas phase which will then pass through the substrates 2 to densify them. An upper tray 6 surmounts the loading and closes the internal volume of each stack. The intermediate support trays 5 are held with vertical pins 7. Such a loading has several drawbacks: it is long and complex to make, and the sealing between the support trays and the stack sections are difficult to guarantee, which may alter the efficiency and uniformity of the densification. This loading also does not allow optimizing the volume occupied in the enclosure of the furnace, the support tray being generally thick. Because of these sealing problems, it is furthermore difficult to implement CVI technologies of the semi-forced flow type which allow reducing the duration of the densification cycles.

There is therefore a need for a densification method by chemical vapor infiltration which does not have the aforementioned drawbacks.

OBJECT AND SUMMARY OF THE INVENTION

The main aim of the present invention is therefore to overcome such drawbacks by proposing a method for densifying porous annular substrates by chemical vapor infiltration, the method comprising at least the following steps:
providing a plurality of unit modules, each unit module comprising a support tray on which porous annular substrates are stacked, the support tray comprising a gas intake opening extended by an injection tube disposed in an internal volume formed by the central passages of the stacked substrates, the injection tube comprising a first end connected to the tray, a second free end and gas injection orifices opening into the internal volume,
forming stacks of unit modules in the enclosure of a densification furnace, each stack comprising at least a second unit module stacked on a first unit module, the intake opening of the support tray of the second unit module communicating with the free end of the injection tube of the second unit module so as to allow the circulation of a gas between the first and the second module, and
injecting, into the stacks of unit modules, a gas phase comprising a gas precursor of a matrix material to be deposited within the porosity of the substrates.

The method according to the invention is remarkable in that it implements unit modules which allow the formation of stacks in the enclosure of the densification furnace in a simpler manner than in the methods of the prior art. Indeed, the unit modules can be prepared outside the enclosure of the furnace and then stacked in the enclosure. The formation of the stacks of unit modules can further be automated. The injection tube of each unit module also plays the role of thermal mass ensuring a gas preheating function and making it possible to reduce the preheating area in the loading and increase the rate of loading in the enclosure. The stacks of unit modules allow improving compactness because there is no longer any need for vertical pins and intermediate support trays, which also allows increasing the rate of loading in the enclosure. Furthermore, in such a method, it is no longer necessary to monitor the sealing between stack sections and intermediate support trays, but only between the stacked unit modules. The sealing between the different stacks are thus improved compared to the methods of the prior art, which allows a more uniform densification of the substrates and the implementation of CVI methods of the semi-forced flow type. The method according to the invention is therefore simpler to implement and more efficient than those implementing for example a loading such as the one described in the introduction.

In one exemplary embodiment, each stack can be surmounted by a cover closing a volume formed by joining the internal volumes of the unit modules of said stack. The cover can have a diameter equal to the diameter of a support tray.

In one exemplary embodiment, each unit module can comprise calibrated orifices providing a leak passage between the internal volume of the stacked substrates and a volume external to the unit module. Thus, the invention applies in particular to chemical vapor infiltration methods called forced flow methods, where the gas phase injected into a stack passes through the substrates using solid spacers positioned between the substrates, and to methods called semi-forced flow methods, where the calibrated orifices providing a leak passage are disposed in the loading to force only part of the gas phase to pass through the substrates. The calibrated orifices can be obtained by spacers positioned for example between the substrates providing a leak passage between the internal volume of the stacked substrates and a volume external to the unit volume.

In one exemplary embodiment, each stack of unit modules can be supported only by a bottom of the enclosure of the densification furnace. In other words, the stacks of unit modules can be independent of each other.

In one exemplary embodiment, each stack of unit modules can be supported by a graphite cylinder comprising a channel communicating with the intake opening of a unit module on the one hand, and with a gas inlet on the other hand. Such a cylinder allows taking up the forces of the entire stack it supports, and also ensures a preheating of the gas phase injected into the stack of unit modules through the gas inlet.

In one exemplary embodiment, the injection orifices can be holes in a wall of the injection tube.

In one exemplary embodiment, the injection orifices can be distributed around and along a wall of the injection tube.

In one exemplary embodiment, each injection orifice can be positioned facing a porous substrate.

In one exemplary embodiment, each support tray can be circular in shape and have a diameter comprised between 90% and 110% of the external diameter of a porous annular substrate, for example equal to the external diameter of a porous annular substrate.

In one exemplary embodiment, the enclosure of the densification furnace can be delimited by a susceptor coupled to an inductor.

In one exemplary embodiment, the enclosure can be cylindrical in shape about an axis. In this case, a stack can be centered along this axis and the other stacks can be distributed about this axis in the enclosure.

In one exemplary embodiment, each porous annular substrate can comprise carbon.

In one exemplary embodiment, each porous annular substrate can constitute a brake disc fiber preform.

BRIEF DESCRIPTION OF THE DRAWINGS

Other characteristics and advantages of the present invention will emerge from the description given below, with reference to the appended drawings which illustrate an exemplary embodiment thereof without any limitation. In the figures.

DETAILED DESCRIPTION OF THE INVENTION

Figure 4:
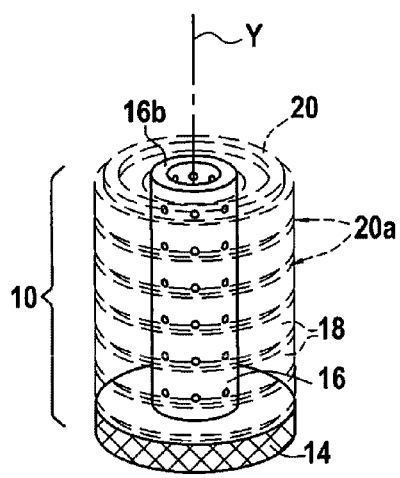
Figure 5:
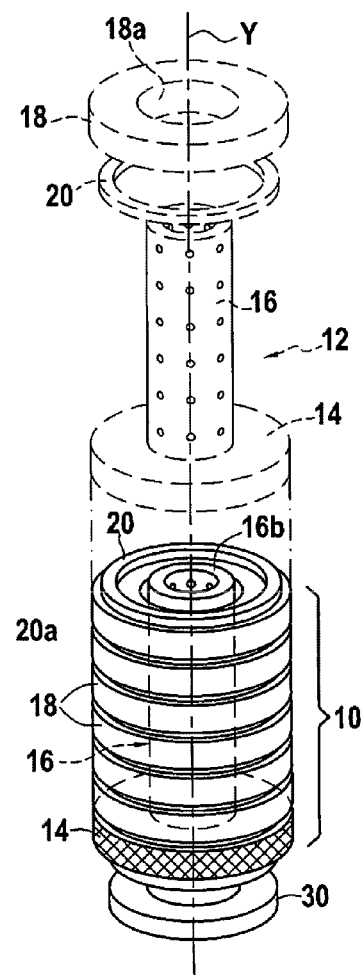

A densification method by chemical vapor infiltration according to the invention firstly comprises a step during which a plurality of unit modules 10 is provided (FIGS. 4 and 5).

Figure 1:
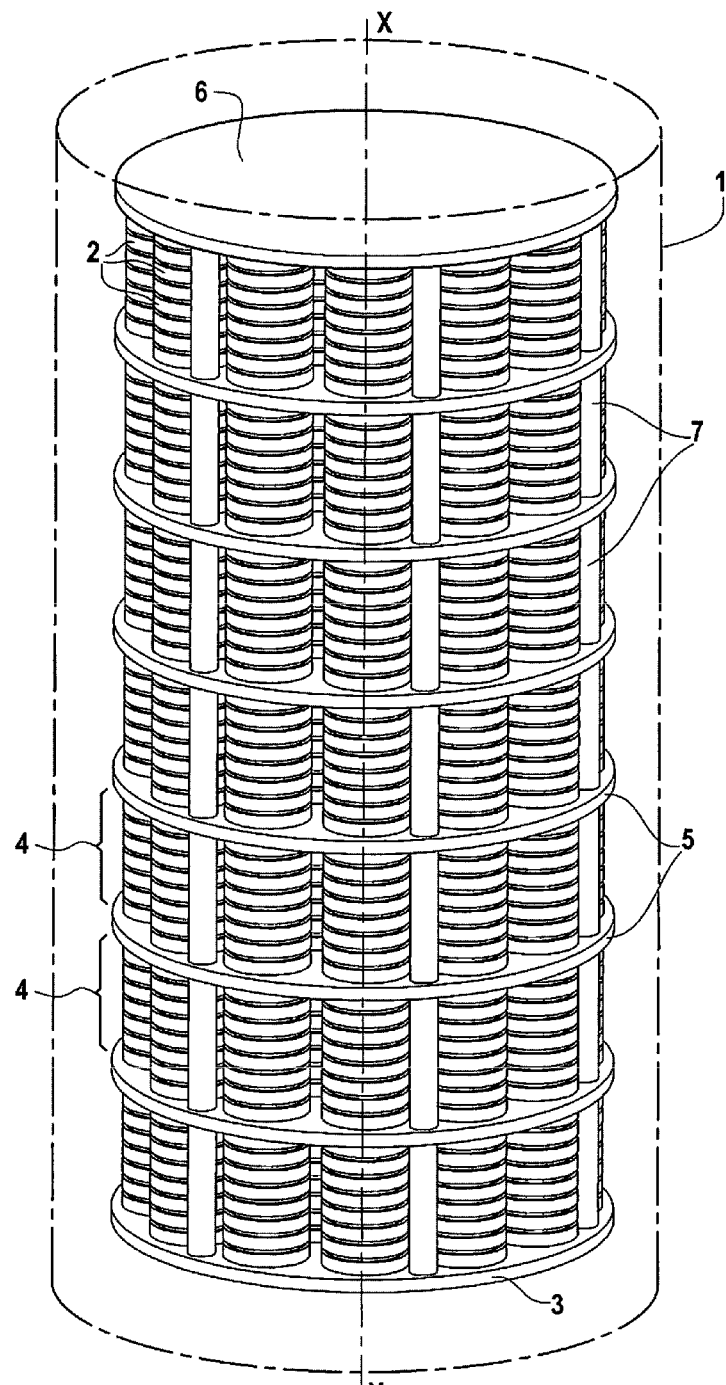
FIG. 1 very schematically shows an example of loading of porous annular substrates according to the prior art.
Figure 2:
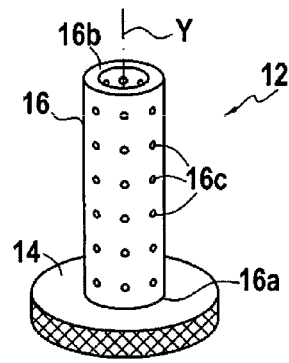
FIGS. 2 and 3 show an example of structural part used to provide a unit module, FIGS. 4 and 5 respectively show a unit module and a way of stacking unit modules, FIG. 6 very schematically shows a loading consisting of stacks of unit modules formed during the implementation of a method according to the invention.
Figure 3:
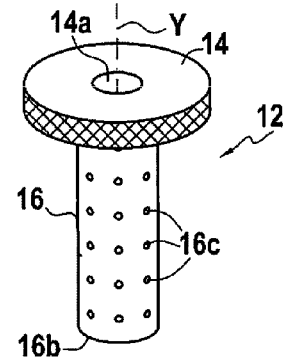

A unit module 10 firstly comprises a structural part 12 (FIGS. 2 and 3) including a support tray 14 provided with a gas intake opening 14a extended by an injection tube 16. The support tray 14, the opening 14a and the injection tube 16 have a shape of revolution about the same axis Y and are centered on this same axis Y. The injection tube 16 here has the shape of a cylinder and the tray support 14 the shape a perforated disc. The injection tube 16 has a first end 16a connected to the support tray 14 and a second free end 16b. The injection tube 16 and the support tray 14 here form one and the same part. As a variant, the injection tube 16 and the support tray 14 can be assembled. The injection tube 16 further comprises a plurality of holes forming gas injection orifices 16c distributed around and along the wall of the injection tube 16. The structural part 12 can be made of graphite and/or of composite material for example of carbon-carbon C/C composite.

A unit module 10 is then produced by forming a stack of porous annular substrates 18 on the support tray 14 of the structural part 12. Each porous annular substrate 18 has a central passage 18a. The porous annular substrates 18 are stacked on the support tray 14 such that the injection tube 16 is present inside an internal volume 17 formed by the central passages 18a of the stacked substrates 18. The porous substrates 18 and the unit module 10 are centered on the same axis Y. It is advantageous that the gas injection orifices 16c are positioned along and around the wall of the injection tube 16 so as to be located facing the substrates 18. In this example, the substrates 18 have an external diameter substantially equal to that of the support tray 14 for greater compactness. The diameter of an injection tube 16 is here smaller than the diameter of the central passage 18a of a porous substrate 18 to leave a space ensuring good circulation of the gas phase in the internal volume 17.

In the example illustrated, a porous substrate 18 is separated from an adjacent substrate or from the support tray 14 by one or more spacers 20 which define intervals 20a. The spacers 20 are for example disposed radially with respect to the axis Y of a module 10 and are arranged to form passages communicating the internal volume 17 of the stacked substrates with an external volume 22 (FIG. 7) located outside the stacks, in the enclosure 10.

The passages formed by the spacers 20, constituting calibrated orifices in the loading, can offer a more or less restricted passage section so as to allow the existence of a pressure gradient between the volumes 17 and 22, as described in the patent application FR 2821859, this then referred to as forced flow (zero passage section) or semi-forced (non-zero passage section) CVI densification. It will be noted that calibrated orifices forming such a leak passage can be provided at other locations, for example only at the bottom or at the top of a stack, within the cover surmounting the stack or a support at the base of a stack.

Figure 6:
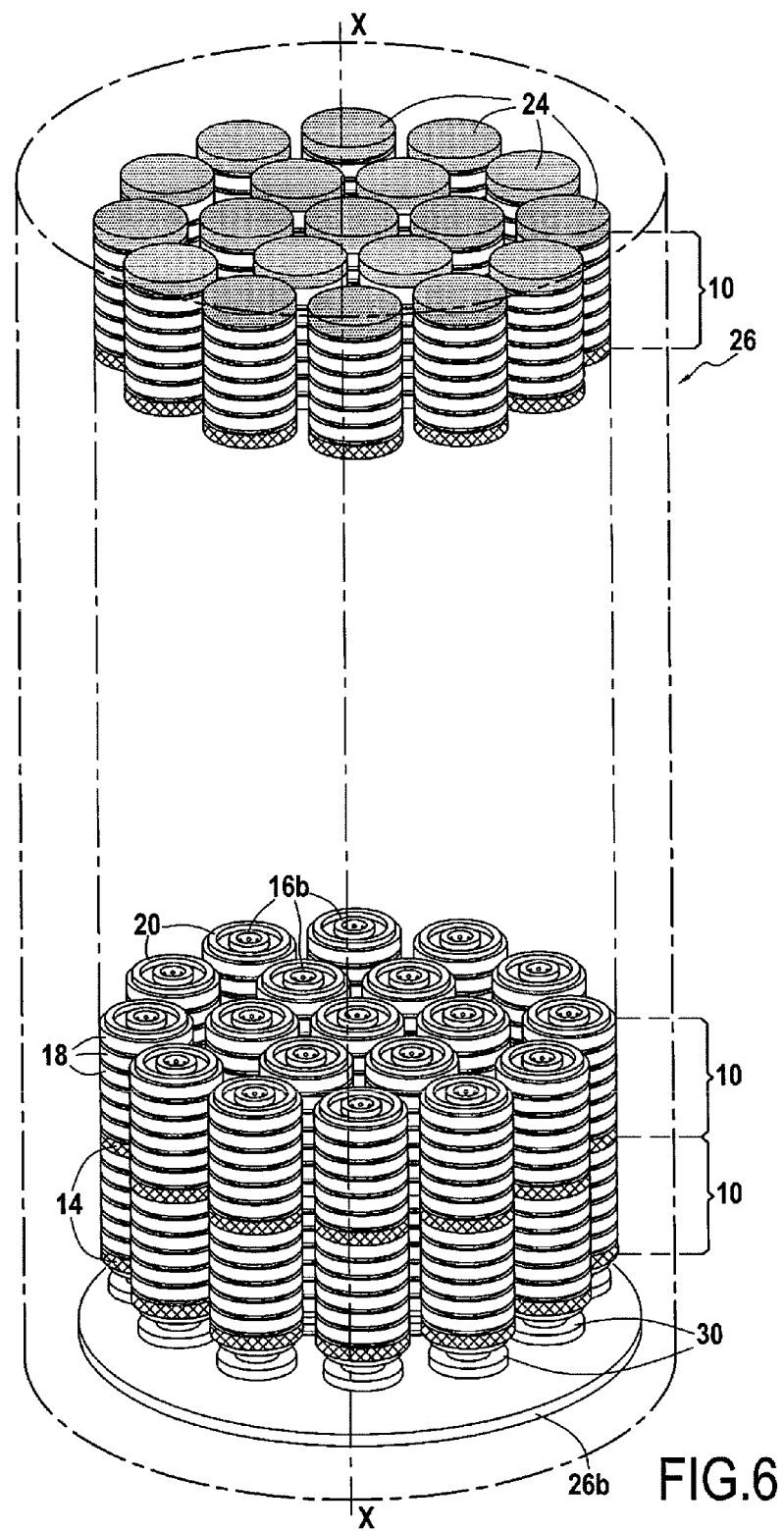
Figure 7:
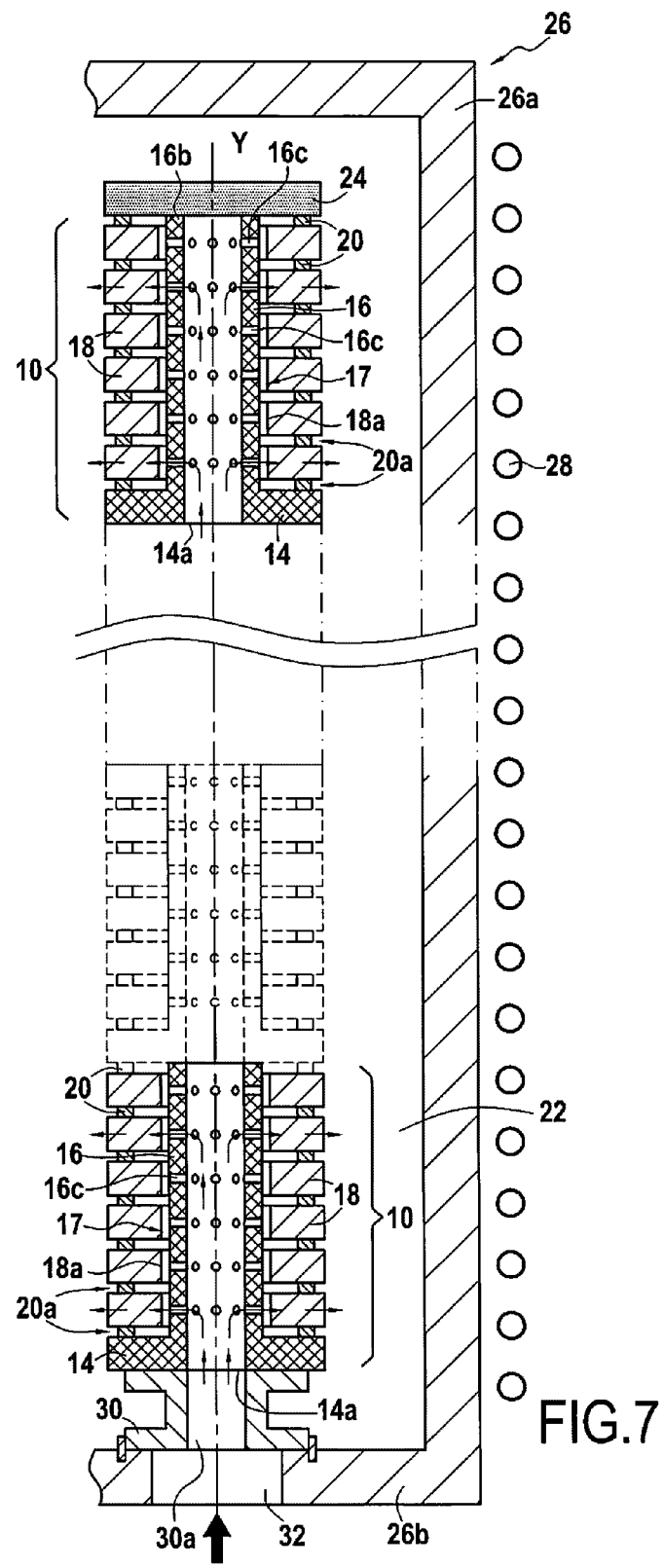
FIG. 7 shows a sectional view of a stack of unit modules inside the enclosure of a densification furnace.

Thus, each unit module 10 comprises, in the illustrated example, a stack of substrates 18 between which spacers 20 are present, the stack of substrates 18 being placed on a spacer 20 in contact with the support tray 14, and being surmounted by a spacer 20 intended to be in contact with another unit module 10 or with a cover 24 (FIGS. 6 and 7). The length of the injection tube 16 is here such that the free end 16b thereof ends at the same level as an upper face of the last spacer 20.

The substrates 18 are for example carbon fiber preforms or blanks formed of pre-densified preforms, intended for the production of brake discs made of carbon/carbon (C/C) composite material, by densification with a pyrolytic carbon matrix.

FIG. 5 shows how the stack of two unit modules 10 is made. To make such a stack, the support tray 14 of the upper module 10 is laid on the last spacer 20 and the free end 16b of the injection tube 16 of the lower module 10 by centering the modules 10 along the same axis Y. The injection tube 16 of the lower unit module 10 is thus in contact with the support tray 14 of the upper unit module 10 so as to take up the mass thereof. One or more seals can be present on the lower face of a support tray 14 intended to be in contact with a free end 16b of an injection tube and/or on the free end of the injection tube 16b intended to be in contact with a support tray 14.

The method according to the invention comprises the formation of several stacks of unit modules 10 directly in the enclosure 26 of a densification furnace, either manually or automatically. It is for example possible to provide the unit modules 10 outside the enclosure 26, then to form the stacks inside the enclosure 26. It is also envisaged to load a stack of modules 10 all at once into the enclosure 26.

FIG. 6 schematically shows the loading of substrates 18 into the enclosure 26 of a densification furnace obtained after having formed stacks of unit modules 10. The enclosure 26 is represented schematically in dotted lines, and only the two first and the last unit modules of each stack have been represented for greater readability. The loading of substrates 18 comprises a plurality of stacks of unit modules 10, in this example nineteen stacks are present in the enclosure 26. Each stack of unit modules 10 comprises, in this example, seven unit modules.

Each stack of unit modules 10 is surmounted by a cover 24 which closes the volume formed by joining the internal volumes 17 of the stack. At its base, each stack of unit modules 10 comprises a graphite cylinder 30 centered on the axis Y of the stacked unit modules 10, comprising a central channel 30a communicating with the gas intake opening 14a of the support tray 14 of a unit module 10 on the one hand, and with a gas inlet 32 provided in a bottom 26b of the enclosure 26 on the other hand. The graphite cylinder 30 is fixed on the bottom 26b of the enclosure 26. There is, in this example, as many gas inlets 32 as there are stacks of unit modules 10 in the enclosure 26. The graphite cylinder 30 allows taking up the forces of the stack acting as a thermal mass ensuring a preheating of the gas phase entering the stack.

The enclosure 26 comprises a heated wall 26a which here constitutes a susceptor laterally delimiting the enclosure 26. More specifically, the wall 26a is here an armature which is inductively coupled with an inductor 28 present around the enclosure 26. In the illustrated example, the loading of porous substrates 18 is adapted to the cylindrical shape of the enclosure 10 about the axis X. Particularly, the stacks of unit modules 10 are distributed in the enclosure 26 about the axis X.

Once the loading has been made, a gas phase (or reactive gas) containing one or more carbon precursor constituents is introduced into the enclosure 26 through the gas inlets 32. The introduced gas phase is conveyed, for each stack, by the cylinder 30 up to the gas intake opening 14a of the first unit module 10 of the stack. The gas phase then arrives in the injection tubes 16 of each stack to be injected at the internal volume 17 formed by the central passages 18a of the substrates 18 through the injection orifices 16c. The more or less significant pressure difference between the internal volume of each stack and the external volume 22 ensures that the gas phase passes through the substrates 18 in order to densify them. Once the gas phase has passed through the substrates 18, it reaches the external volume 22 and can finally be discharged through a discharge port (not represented) arranged in an upper wall of the enclosure 26, which can be optionally associated with suction means.

Typically, the gas phase comprises a carrier gas and one or more gas matrix precursors. To form a carbonaceous matrix, methane, propane or a mixture of both can be used as a gas precursor. The carrier gas can be natural gas.

The invention claimed is:

1. A method for densifying porous annular substrates by chemical vapor infiltration, the method comprising at least the following steps:
providing a plurality of unit modules, each unit module comprising a support tray on which porous annular substrates are stacked, the support tray comprising a gas intake opening extended by an injection tube disposed in an internal volume formed by the central passages of the stacked substrates, the injection tube comprising a first end connected to the tray, a wall portion, extending away from the first end, along the internal volume, a second free end at a position distal from the first end, and gas injection orifices arrayed along sides of the wall portion and opening into the internal volume,
forming stacks of unit modules in the enclosure of a densification furnace, each stack comprising at least a second unit module stacked on a first unit module, the intake opening of the support tray of the second unit module communicating with the free end of the injection tube of the second unit module so as to allow the circulation of a gas between the first and the second module, and
injecting, into the stacks of unit modules, a gas phase comprising a gas precursor of a matrix material to be deposited within the porosity of the substrates.

2. The method according to claim 1, wherein each unit module comprises calibrated orifices providing a leak passage between the internal volume of the stacked substrates and a volume external to the unit module.

3. The method according to claim 1, wherein each stack of unit modules is supported by a graphite cylinder comprising a channel communicating with the intake opening of a unit module on the one hand, and with a gas inlet on the other hand.

4. The method according to claim 1, wherein the injection orifices are holes in a wall of the injection tube.

5. The method according to claim 1, wherein the injection orifices are distributed around and along a wall of the injection tube.

6. The method according to claim 1, wherein each injection orifice is located facing a porous annular substrate.

7. The method according to claim 1, wherein each support tray is circular in shape and has a diameter comprised between 90% and 110% of the external diameter of a porous annular substrate.

8. The method according to claim 1, wherein the enclosure of the densification furnace is delimited by a susceptor coupled to an inductor.

9. The method according to claim 1, wherein each porous annular substrate comprises carbon.

10. The method according to claim 1, wherein each porous annular substrate constitutes a brake disc fiber preform.

11. A method for densifying porous annular substrates by chemical vapor infiltration, the method comprising at least the following steps:
providing a plurality of unit modules, each unit module comprising a support tray on which a single stack of porous annular substrates are stacked, the support tray comprising a gas intake opening extended by an injection tube disposed in an internal volume formed by the central passages of the stacked substrates, the injection tube comprising a first end connected to the tray, a second free end distal from the first end, and gas injection orifices arrayed along sides of a wall portion of the injection tube and opening into the internal volume,
forming stacks of unit modules in the enclosure of a densification furnace, each stack comprising at least a second unit module stacked on a first unit module, the intake opening of the support tray of the second unit module engaging the free end of the injection tube of the second unit module so as to allow the circulation of a gas between the first and the second module, and injecting, into the stacks of unit modules, a gas phase comprising a gas precursor of a matrix material to be deposited within the porosity of the substrates.

12. A method for densifying porous annular substrates by chemical vapor infiltration, the method comprising at least the following steps:
providing a plurality of unit modules, each unit module comprising a support tray on which porous annular substrates are stacked, the support tray comprising a gas intake opening extended by an injection tube disposed in an internal volume formed by the central passages of the stacked substrates, the injection tube comprising a first end connected to the tray, a wall of the injection tube extending away from the first end and disposed in the internal volume, a second free end and gas injection orifices arrayed along sides of the wall and opening into the internal volume, wherein the injection orifices are holes in the wall of the injection tube,
forming stacks of unit modules in the enclosure of a densification furnace, each stack comprising at least a second unit module stacked on a first unit module, the intake opening of the support tray of the second unit module communicating with the free end of the injection tube of the second unit module so as to allow the circulation of a gas between the first and the second module, and
injecting, into the stacks of unit modules, a gas phase comprising a gas precursor of a matrix material to be deposited within the porosity of the substrates.

13. A method for densifying porous annular substrates by chemical vapor infiltration, the method comprising at least the following steps:
providing a plurality of unit modules, each unit module comprising a support tray on which porous annular substrates are stacked, the support tray comprising a gas intake opening extended by an injection tube disposed in an internal volume formed by the central passages of the stacked substrates and extending substantially along a length of the internal volume, the injection tube comprising a first end connected to the tray, a second free end and gas injection orifices in an external wall thereof, the gas injection orifices opening into the internal volume,
wherein a diameter of the injection tube is smaller than a diameter of the central passages of the stacked substrates such that the external wall of the injection tube is disposed spaced apart from the internal radii of the central passages,
forming stacks of unit modules in the enclosure of a densification furnace, each stack comprising at least a second unit module stacked on a first unit module, the intake opening of the support tray of the second unit module communicating with the free end of the injection tube of the second unit module so as to allow the circulation of a gas between the first and the second module, and
injecting, into the stacks of unit modules, a gas phase comprising a gas precursor of a matrix material to be deposited within the porosity of the substrates.

* * * * *